United States Patent
Salling et al.

(10) Patent No.: US 6,724,050 B2
(45) Date of Patent: Apr. 20, 2004

(54) ESD IMPROVEMENT BY A VERTICAL BIPOLAR TRANSISTOR WITH LOW BREAKDOWN VOLTAGE AND HIGH BETA

(75) Inventors: Craig T. Salling, Plano, TX (US); Zhiqiang Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/051,639

(22) Filed: Jan. 18, 2002

(65) Prior Publication Data
US 2003/0137029 A1 Jul. 24, 2003

(51) Int. Cl.[7] .............................................. H01L 23/62
(52) U.S. Cl. .................... 257/362; 257/592; 257/565; 257/361; 257/546; 257/552; 257/378
(58) Field of Search ................... 257/360, 361, 257/362, 355, 328, 378, 552, 592, 549, 546, 565, 358, 349, 370

(56) References Cited

U.S. PATENT DOCUMENTS

| 5,006,476 | A | * | 4/1991 | De Jong et al. ............ 438/234 |
| 5,024,541 | A | * | 6/1991 | Tsukada et al. ................ 400/8 |
| 5,028,977 | A | * | 7/1991 | K. O. Kenneth et al. ... 257/370 |
| 5,268,588 | A | * | 12/1993 | Marum ........................ 257/362 |
| 5,675,175 | A | * | 10/1997 | Iranmanesh .................. 257/565 |
| 6,455,902 | B1 | * | 9/2002 | Voldman ..................... 257/378 |

* cited by examiner

Primary Examiner—Jerome Jackson
Assistant Examiner—Matthew C. Landau
(74) Attorney, Agent, or Firm—W. James Brady, III; Frederick J. Telecky, Jr.

(57) ABSTRACT

A vertical bipolar transistor having low breakdown voltage, low ESD clamping voltage and high beta is fabricated in a semiconductor 301 of a first conductivity type, which has a buried layer 360 of the opposite conductivity type with sharp junctions, suitable as collector. This layer extends laterally to deep wells 371 of the opposite conductivity type, thus isolating the subsurface band 301a of the semiconductor of the first conductivity type. This band is suitable as the base and has a width 301c controlled by the proximity of the buried layer junction 360a. The emitter 310 is supplied by a surface region of the opposite conductivity type.

The photomask, which is needed for implanting the low energy ions to create the extended emitter, is also used for the process step of implanting, at high energy and high dose, the ions needed (opposite conductivity type) to create the buried layer. This economical feature renders the additional high-energy ion implant step and thus the formation of an electrically isolated high-voltage I/O transistor exceedingly inexpensive.

7 Claims, 2 Drawing Sheets

ESD IMPROVEMENT BY A VERTICAL BIPOLAR TRANSISTOR WITH LOW BREAKDOWN VOLTAGE AND HIGH BETA

FIELD OF THE INVENTION

The present invention is related in general to the field of electronic systems and semiconductor devices, and more specifically to structure and fabrication method of a buried n-type layer, resulting in a vertical bipolar transistor with low breakdown voltage and high beta capable of improving ESD protection.

DESCRIPTION OF THE RELATED ART

Integrated circuits (ICs) may be severely damaged by electrostatic discharge (ESD) events. A major source of ESD exposure to ICs is from the charged human body ("Human Body Model", HBM); the discharge of the human body generates peak currents of several amperes to the IC for about 100 ns. A second source of ESD is from metallic objects ("machine model", MM); it can generate transients with significantly higher rise times than the HBM ESD source. A third source is described by the "charged device model" (CDM), in which the IC itself becomes charged and discharges to ground in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an NMOS device whose drain is connected to the pin to be protected and whose source is tied to ground. The protection level or failure threshold can be set by varying the NMOS device width from the drain to the source under the gate oxide of the NMOS device. Under stress conditions, the dominant current conduction path between the protected pin and ground involves the parasitic bipolar transistor of that NMOS device. This parasitic bipolar transistor operates in the snapback region under pin positive with respect to ground stress events.

The dominant failure mechanism, found in the NMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak NMOS device temperature, at which second breakdown is initiated, is known to increase with the stress current level.

Many circuits have been proposed and implemented for protecting ICs from ESD. One method that is used to improve ESD protection for ICs is biasing the substrate of ESD protection circuits on an IC. Such substrate biasing can be effective at improving the response of a multi-finger MOS transistor that is used to conduct an ESD discharge to ground. However, substrate biasing can cause the threshold voltages for devices to change from their nominal values, which may affect device operation. In addition, substrate biasing under steady-state conditions causes heat generation and increases power losses.

Solutions offered in known technology require additional IC elements, silicon real estate, and/or process steps (especially photomask alignment steps). Their fabrication is, therefore, expensive. Examples of device structures and methods are described in U.S. Pat. No. 5,539,233, issued Jul. 23, 1996 (Amerasekera et al., "Controlled Low Collector Breakdown Voltage Vertical Transistor for ESD Protection Circuits"); U.S. Pat. No. 5,793,083, issued Aug. 11, 1998 (Amerasekera et al., "Method for Designing Shallow Junction, Salicided NMOS Transistors with Decreased Electrostatic Discharge Sensitivity"); U.S. Pat. No. 5,940,258, issued Aug. 17, 1999 (Duvvury, "Semiconductor ESD Protection Circuit"); U.S. Pat. No. 6,137,144, issued Oct. 24, 2000, and U.S. Pat. No. 6,143,594, issued Nov. 7, 2000 (Tsao et al, "On-Chip ESD Protection in Dual Voltage CMOS); and U.S. patent application Ser. No. 09/456,036, filed Dec. 3, 1999 (Amerasekera et al., "Electrostatic Discharge Device and Method").

The influence of substrate well profiles on the device ESD performance is investigated, for instance, in "Influence of Well Profile and Gate Length on the ESD Performance of a Fully Silicided 0.25 $\mu$m CMOS Technology" (K. Bock, C. Russ, G. Badenes, G. Groeseneken and L. Deferm, Proc. EOS/ESD Symp., 1997, pp. 308–315). However, known technology recommends only a lower epitaxial doping or a lower implant dose as methods to increase the p-well resistance.

The challenge of cost reduction implies a drive for minimizing the number of process steps, especially a minimum number of photomask steps, and the application of standardized process conditions wherever possible. Furthermore, the silicon area consumed by ESD protection devices should be kept to a minimum. An urgent need has, therefore, arisen for a coherent, low-cost method of enhancing ESD insensitivity without the need for additional, real-estate consuming protection devices. The device structure should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

A vertical bipolar transistor is described having low breakdown voltage, low ESD clamping voltage and high beta. The transistor is fabricated in a semiconductor of a first conductivity type, which has a buried layer of the opposite conductivity type with sharp junctions, suitable as collector. This layer extends laterally to deep wells of the opposite conductivity type, thus isolating the subsurface band of the semiconductor of the first conductivity type. This band is suitable as the base and has a width controlled by the proximity of the buried layer junction. The emitter is supplied by a surface region of the opposite conductivity type.

The buried layer extends vertically from the surface beginning at a level more shallow than the depth of the dielectric isolation zone, which surrounds the transistor at least in part. The layer extends to a depth greater than the depth of this dielectric zone, thereby electrically isolating the base and emitter of the vertical transistor.

It is an essential aspect of the invention to use the photomask step, which is needed for implanting the low energy ions in order to create the extended emitter, for the additional process step of implanting at high energy and high dose the ions needed (opposite conductivity type) to create the buried layer. This economical feature renders the additional high-energy ion implant step and thus the formation of an electrically isolated high-voltage I/O transistor exceedingly inexpensive.

Another aspect of the invention is that an additional implant step of ions of the fist conductivity type, also of high energy, but low dose, may be added for the same photomask window in order to carefully control location, peak and depth of the buried layer. This feature provides precise control of the transistor base width and thus beta.

Another aspect of the invention is that the high energy/ high dose ion implant step transforms the electrically isolated band of the first conductivity type into a region of higher resistivity compared to the remainder of the semiconductor material of the first conductivity type.

The present invention is equally applicable to nMOS and pMOS transistors; the conductivity types of the semiconductor and the ion implant types are simply reversed.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Patent Application No. 60/263,619, filed on Jan. 23, 2001 (Salling et al., "Structure and Method of MOS Transistor having Increased Substrate Resistance") and to U.S. Patent Application TI # 32535, submitted on Jan. 16, 2002 (Salling et al. "Eliminating Substrate Noise by an Electrically Isolated High-Voltage I/O Transistor").

Figure 1A:
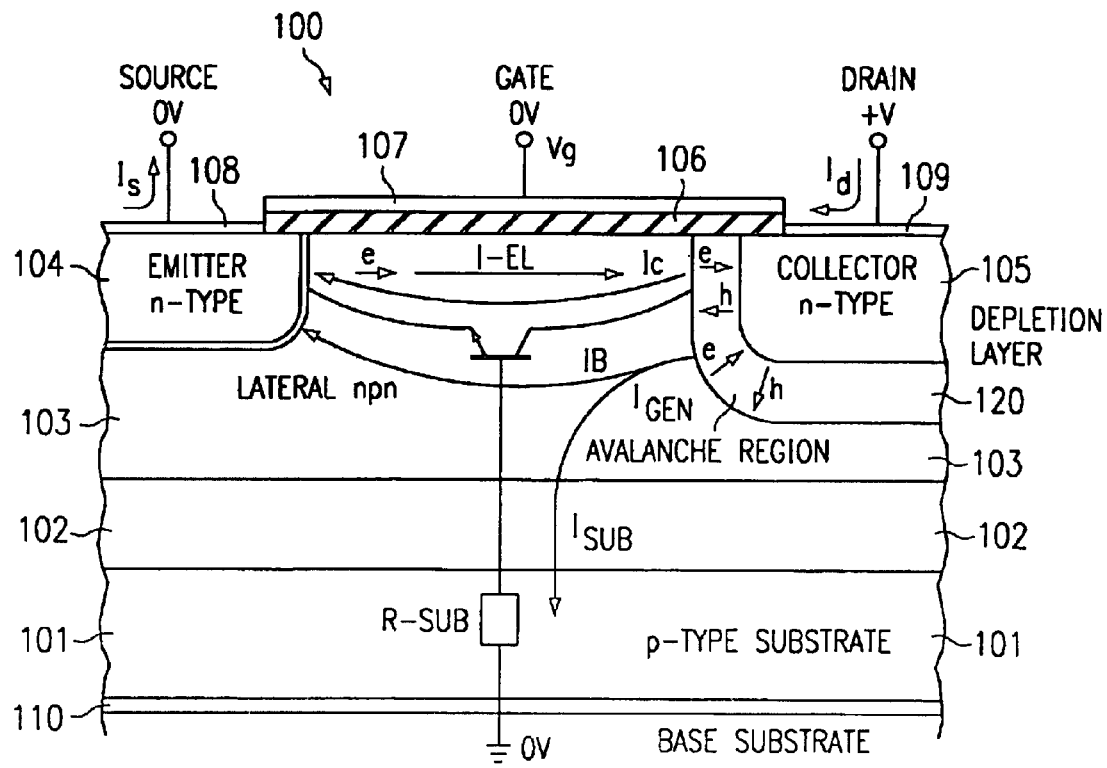
FIG. 1A is a simplified and schematic cross section through a lateral MOS transistor, illustrating the current flow at an electrostatic discharge event, with the ground contact of the substrate current Isub at the back of the device.

The impact of the present invention can be most easily appreciated by highlighting the shortcomings of the known technology. The schematic cross section of FIG. 1A illustrates a commonly used integrated circuit (IC) component 100 in an ESD protection circuit, namely an nMOS transistor which operates in the mode of a lateral bipolar npn transistor during an ESD event and provides a low impedance current path to ground. The IC is formed in a semiconductor of a "first conductivity" type; in the example of FIG. 1A, this "first conductivity" is p-type, the MOS transistor is an nMOS transistor, and the lateral bipolar transistor is an npn transistor. In present manufacturing, the first conductivity type semiconductor is created by the net doping due to a "substrate" and a "well".

As defined herein, the term "substrate" refers to the starting semiconductor wafer. In present manufacturing, the substrate typically has p-type doping. For clarity, this case is also selected as the basis for the following discussions. It should be stressed, however, that the invention and all description also cover the case where the substrate has n-type doping. In FIG. 1A, the substrate is designated 101. Frequently, but not necessarily, an epitaxial layer 102 of the same conductivity type as the substrate has been deposited over the substrate 101; in this case the term "substrate" refers to epitaxial layer 102 plus starting semiconductor 101. For the conductivity example selected for FIG. 1A, a p-well 103 has been formed by localized acceptor ion implantation and annealing. An n-plus source region 104 (the emitter of the bipolar transistor) and drain region 105 (the collector of the bipolar transistor) were formed by shallow ion implants of donors. The surface between the emitter 104 and the collector 105 is covered by gate oxide layer 106. Layers 107, 108, 109, and 110 provide metallic contacts to the gate, emitter, collector and the wafer backside, respectively.

FIG. 1A further shows that emitter 108, gate 107 and wafer backside 110 are electrically connected to ground potential (0 V). A positive voltage spike at the collector, as caused by an ESD event, applies a reverse bias to the collector/base junction; the base is the substrate 101 (in some devices, epitaxial layer 102 plus the substrate 101); the depletion layer of the space charge region is designated 120. When the electric field in the depletion region 120 exceeds the breakdown field, avalanching occurs and forms electron/ hole pairs. Electrons flow into the collector, and holes flow into the p-type base.

This hole current I-sub flows from the collector junction through the substrate to the backside contact 110, causing a voltage drop across the resistors R-pwell and R-sub, which positive (forward) biases the emitter/base junction. This emitter forward bias is proportional to the effective "substrate resistance" equal to the sum of the resistance components in the current path R-pwell and R-sub, which are schematically pulled together as R-sub in FIG. 1A. Those of the electrons injected from the emitter into the base which reach the collector depletion layer will participate in the avalanche mechanism.

Figure 1B:
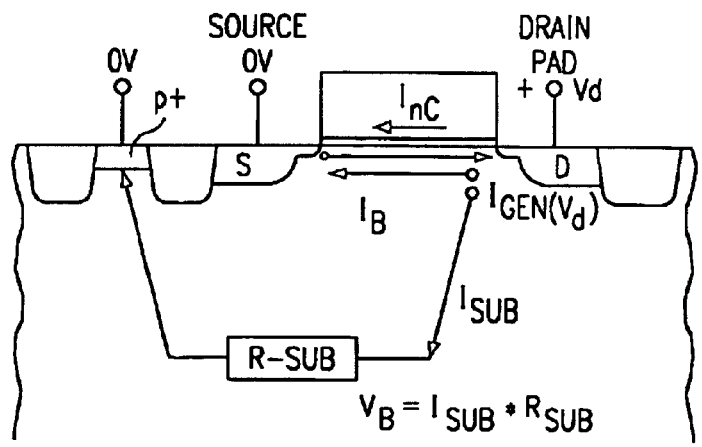
FIG. 1B is a still more simplified cross section through a MOS transistor analogous to FIG. 1A yet with the ground contact of the substrate current Isub located at the surface.

In the schematic cross section of FIG. 1B, the same layout and electrical scenario as in FIG. 1A is depicted with the exception that the ground contact for the substrate current Isub is located at the surface instead of at the backside of the device. This arrangement of FIG. 1B is frequently used in circuit designs.

Figure 2:
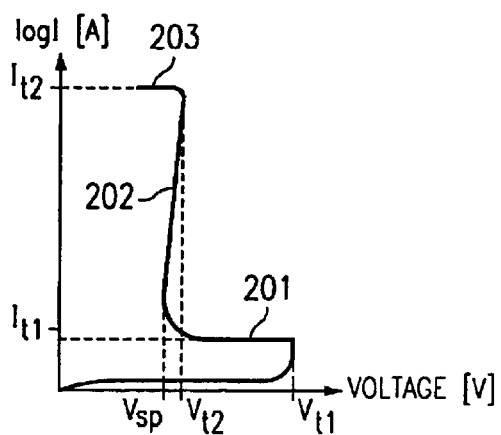
FIG. 2 is a schematic plot of drain (collector) current, on a logarithmic scale, as a function a drain voltage, on a linear scale, illustrating the onset of the second breakdown phenomenon.

The electron concentration will be multiplied in accordance with the electric field dependent avalanche multiplication factor. The resulting reduction of the device impedance is reflected in a "snap back" 201 in the current-voltage characteristic, which corresponds to a "turn on" of the bipolar transistor. FIG. 2 plots the collector (or drain) current I (on a logarithmic scale) as a function of drain voltage V (on a linear scale). As illustrated in FIG. 2, this snap-back 201 occurs at the collector/drain voltage Vt1 with an associated collector/drain current It1. The field dependence of the avalanche multiplication factor is responsible for establishing a new stable current/voltage equilibrium 202. At high electron injection levels, base conductivity modulation also contributes towards making the device impedance positive again. It should be mentioned that the lateral npn transistor also protects against negative ESD pulses. The collector 105 (in FIG. 1A) now acts as emitter and diverts the ESD current to the backside substrate contact 110 and to the now reverse biased emitter 104, which now acts as collector.

The current carrying capability of the device is limited by thermal effects in the avalanching collector depletion layer. A number of effects (such as the increase of intrinsic carrier concentration, a reduced carrier mobility, a decrease in thermal conductivity, and a lowering of the potential barrier for tunnel currents) contribute to the onset of the second (thermal) breakdown (203 in FIG. 2). The second breakdown trigger current It2 is very sensitive to the device design, especially the doping profiles. Second breakdown results in junction melting and in an irreversible increase in leakage currents. It must, therefore, be avoided for normal device operation.

It is important for the present invention to conclude from FIGS. 1A and 1B and the above discussion of FIG. 2 that increasing the resistors R-pwell and/or R-sub will lead to an earlier turn-on of the emitter and to a reduction of the current contribution of the avalanche mechanism. This is reflected in an increase of the second breakdown threshold current It2. As was pointed out in the above-referenced publication by K. Bock et al., the p-well resistance R-pwell, and thus It2, can be modified by the pwell doping. However, known technology recommended only a lower substrate (or epitaxial) doping or a lower implant dose as methods to increase the p-well resistance.

The present invention increases the substrate resistance as a welcome side effect of the fabrication of the collector by ion implantation; the collector has a low breakdown voltage and thus low ESD clamping voltage. The invention furthermore creates a silicon area-saving vertical transistor, and accomplishes this feature without an additional photomask step. Finally, the invention allows a fine-tuned control of the base width to be traversed by the collector current (and thus high beta of the transistor) again without an additional photomask step.

Figure 3:
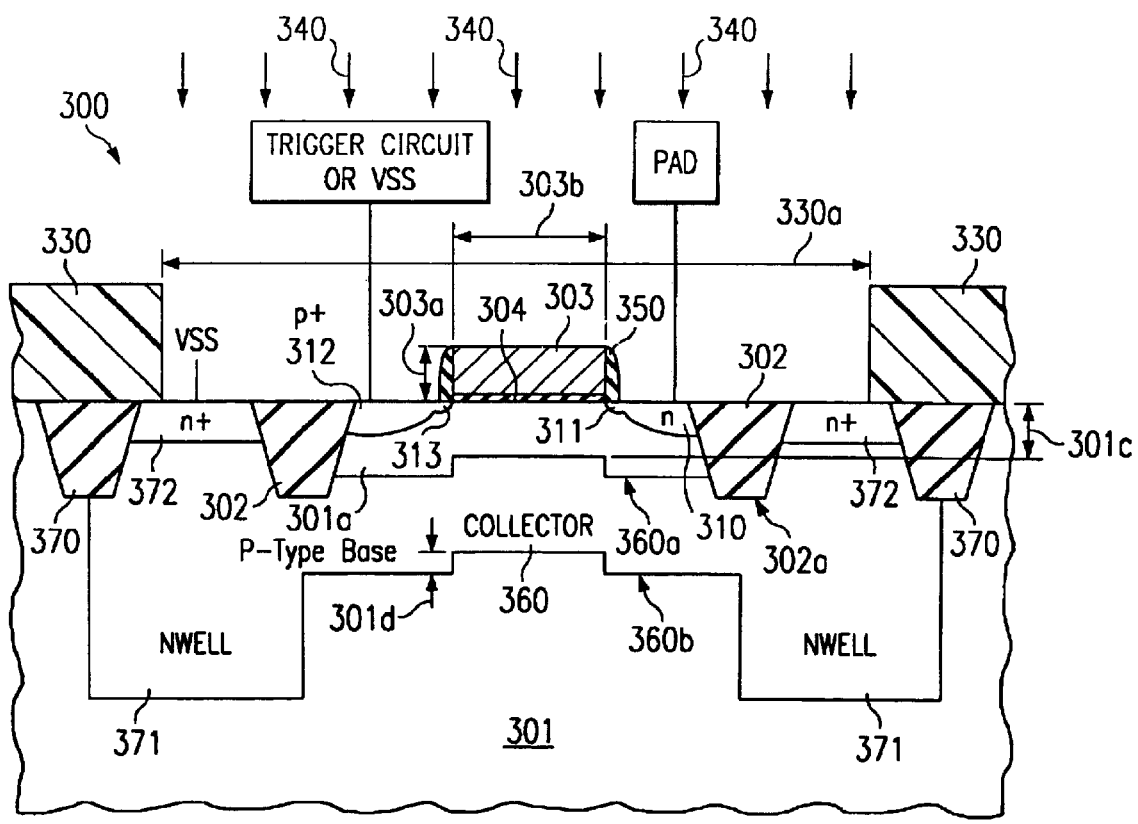
FIG. 3 is a schematic cross section of a vertical bipolar transistor with buried collector as provided by the process flow of the invention.

FIG. 3 shows in simplified and schematic (not to scale) manner a small portion of an IC, generally designated 300, having on its surface the transistor structure of the invention. The invention applies to bipolar npn as well as pnp transistors fabricated into semiconductor material 301, often referred to as the substrate. Here, the substrate may comprise a p-type semiconductor wafer, onto which, for some devices, an epitaxial layer, also of p-type doping, has been deposited. (For clarity, the description and discussion of the invention will be for a p-type semiconductor as the "first" conductivity type. However, the invention is also applicable, if an n-type substrate is used as the first conductivity type material). The semiconductor material may be silicon, silicon germanium, gallium arsenide or any other semiconductor material used in IC fabrication.

The resistivity of the semiconductor substrate 301, into which the bipolar transistor is fabricated, ranges from about 1 to 50 Ωcm (this is also the resistivity of the epitaxial layer). Frequently, the material close to the bipolar transistor may be generated as a well of the first conductivity type, in the example of FIG. 3 a p-well.

FIG. 3 shows two nested pairs of dielectric isolation zones, formed into substrate 301. These isolation zones are also referred to as silicon dioxide isolation trenches. The inner pair 302 defines the lateral boundaries of the bipolar transistor structure, and the outer pair 370 defines the lateral extent of the area between the deep wells 371. The isolation zones are preferably 350 nm deep.

The wells are of the conductivity type opposite to the "first" conductivity type; in the example of FIG. 3, well 371 is an n-well; it is contacted by n+-region 372. The n-well completely surrounds the bipolar transistor structure, and it is reaches deep from the surface into the semiconductor material 301 of the first conductivity type (p-type in FIG. 3).

For the dummy gate 303 of the structure, polysilicon or another conductive material is usually chosen; its thickness 303a is commonly between 140 and 180 nm, and the width 303b between 0.2 and 1.0 μm. The poly-mask insulator 304 (silicon dioxide, nitrided SiO2, or others) has a physical thickness between 1 and 10 nm. In FIG. 3, the poly-mask and dummy gate structure serves the purpose of a physical separation between the transistor emitter and base contact and a control of the shape and outlines of the buried layer. The fabrication proceeds in parallel with the fabrication of any MOS transistors of the IC without any extra photomasks.

FIG. 3 shows a deep emitter 310 and an extended emitter 311, further a deep base contact 312 and an extended base contact 313. The emitter is n-type, the contact heavily p+-type. The extended emitter and contact are prepared by low-energy, shallow implants (depth typically between 25 and 40 nm), using n-doping ions for the emitter, and p-doping ions for the contact. The deep emitter and contact are prepared by medium-energy implants (depth typically between 100 and 140 nm) as part of the process flow discussed later. For the fabrication of the emitter, a window 330a in a photoresist layer 330 is used; window 330a determines the lateral extent and active area of the transistor structure.

The same photoresist and window are used for the high-energy and high dose implant 340 of the present invention. This implant is performed for creating the buried layer 360 within the opening of window 330a. In FIG. 1, buried layer 360 is n-type. As further consequence of the high energy ion implant 340, the p-type semiconductor material portion 301a between surface and the buried layer 360 acquires a resistivity higher than the resistivity of the remainder 301 of the p-type semiconductor material.

It is an important technical advantage of the invention that a supplemental p-type ion implant of high energy, but low dose, may be added subsequent to, or even simultaneous with, the above-described n-type implant, in order to sensitively control the location, peak and depth of the buried layer. This control is instrumental in creating a sharp collector junction, leading to low collector breakdown voltage and low ESD clamping voltage, and a narrow base width, leading to high beta.

Laterally, the buried layer 360 extends to the n-well 371. Consequently, the buried layer electrically isolates the near-surface portion 301a of the p-type material (the "band") from the remainder 301 of the semiconductor material. Buried layer 360 serves as the collector, with contacts provided by the n+ regions 372. The bipolar transistor is, therefore, a vertical transistor, completely positioned within this isolated band 301a, and is thus an electrically isolated transistor.

Vertically, the position of the buried layer 360 relative to the surface depends on the energy of the implanted n-type ions. Beginning at a level 360a more shallow than the depth 302a of dielectric isolation zone 302, the buried layer 360 extends to a depth 360b greater than the depth 302a of the dielectric zone 302. In this manner, it is assured that layer 360 merges with n-well 371.

As a consequence of the fabrication process flow, the isolated p-type band 301a is shallower under the dummy poly gate 303 by a measurable distance 301d. The thickness of the remaining distance 101c depends on the energy of the implanted n-type ions. The exact contours of the doping profile of layer 360 can be measured by imaging the 2-dimensional profile of the buried n-type layer, for instance by using a 2-dimensional SIMS technique after cleaving and diode-etching the sample.

It may be mentioned that the thickness of the photoresist layer 330 is larger than the thickness solely required to block the lower energy implants. Preferably, the photoresist layer thickness is between 1.5 and 2.0 $\mu$m. If the high-energy implant accompanies the medium-energy implant, non-conductive sidewalls 350 are typically present as part of the dummy gate structure.

For vertical npn transistors, the semiconductor of the first conductivity type (p-type) (including any epitaxial layer) has dopant species selected from a group consisting of boron, aluminum, gallium, and indium. The emitter and the buried collector within the semiconductor of the first conductivity type have a dopant species selected from a group consisting of arsenic, phosphorus, antimony, and bismuth.

For vertical pnp transistors, the semiconductor of the first conductivity type (n-type) has dopant species selected from a group consisting of arsenic, phosphorus, antimony, and bismuth. The emitter and the buried collector within the semiconductor of the first conductivity type have a dopant species selected from a group consisting of boron, aluminum, gallium, indium, and lithium.

As for electrical circuit connections, emitter 310 is connected to the I/O pad to be protected against ESD damage, base contact 312 is connected to the trigger circuit or Vss, and collector and n-well contact 372 to Vss.

The method of fabricating, in a semiconductor region of a first conductivity type (peak doping concentration about $4 \cdot 10E17$ to $1 \cdot 10E18$ cm-3) having two wells of the opposite conductivity type, a vertical bipolar transistor, comprises the steps of:

depositing a photoresist layer over the surface of semiconductor region of the first conductivity type and opening a window in this layer, exposing the surface area between the wells of the opposite conductivity type;

implanting, at low energy, ions of the opposite conductivity type through the window, creating a shallow layer (about 10 to 50 nm deep) of opposite conductivity (peak concentration from about $5 \cdot 10E17$ to $5 \cdot 10E20$ cm-3) under the surface, suitable as the emitter of the transistor; and implanting, at high energy and high dose ions of the opposite conductivity type (ions selected in the energy range from about 400 to 700 keV such that the peak concentration is at a different depth than that of the semiconductor of the first conductivity type, and in the dose range of about $8 \cdot 10\ E12$ to $8 \cdot 10E13$ cm-2 to overcompensate the semiconductor doping of the first conductivity type) into the band of first conductivity type through said window. This implant creates a deep buried layer having a net doping of the opposite conductivity type at a depth of more than 200 nm. The layer is between, and connecting to, the wells; it is suitable as the collector of the transistor.

Further, the near-surface band of first conductivity type has a doping concentration lower than that of the remainder of the semiconductor; the band is suitable as the base of the transistor.

The method of fabricating, in a near-surface region of a semiconductor of a first conductivity type, a vertical bipolar transistor, comprising the steps of:

forming two nested pairs of dielectric isolation zones into the semiconductor material, the inner pair defining the lateral boundaries of the bipolar transistor, and the outer pair defining the area between wells of the opposite conductivity type;

implanting doping ions of the first or opposite conductivity type to adjust the background doping level of the near-surface region ("band") of the semiconductor of the first conductivity type; after the background doping adjustment implant, the semiconductor of the first conductivity type has a peak doping concentration between $4 \cdot 10E17$ and $1 \cdot 10OE18$ cm-3;

forming wells of the opposite conductivity type into the adjusted semiconductor material;

depositing over the surface a layer of insulating material suitable as poly-mask dielectric, covering the area between the lateral boundaries of the transistor;

depositing a layer of poly-silicon or other conductive material onto the insulating layer;

protecting a portion of the poly-silicon and etching the remainder thereof, defining the poly-mask area between the lateral boundaries of the transistor;

depositing a first photoresist layer and opening a window therein, exposing the surface of the area between outer dielectric isolation zones;

implanting, at low energy (conditions see above), ions of the opposite conductivity type into the exposed surface area, creating a shallow layer under the surface, suitable as emitter of the transistor;

implanting, at high energy and high dose (conditions see above), ions of the opposite conductivity type into the exposed surface area, creating a deep region (depth more than 200 nm) under the surface having a net doping of the opposite conductivity type between, and continuous with, the wells, while further creating a band having a doping concentration of the first conductivity type lower than that of the adjusted sub-surface semiconductor region of the first conductivity type (peak concentration of about 1 to 6 10E17 cm-3 below the p-n junction of the deep emitter region;

optionally implanting, at high energy and low dose, ions of the first conductivity type for controlling the location, peak and depth of the deep layer of opposite conductivity type;

removing the first photoresist layer;

depositing conformal insulating layers of an insulator, such as silicon nitride or silicon dioxide, over said surface and directional plasma etching said insulating layers so that only side walls around the poly-silicon dummy gate remain;

depositing a second photoresist layer and opening a window therein, exposing the surface of the area between the outer dielectric isolation zones;

implanting, at medium energy, ions of the opposite conductivity type into the exposed surface area, creating a region of the opposite conductivity (peak concentration from about $5 \cdot 10E19$ to $5 \cdot 10E20$ cm-3) that extends to a medium depth (between 50 and 200 nm) under the surface, suitable as emitter of the transistor;

removing said second photoresist layer; and forming a heavily doped region of the first conductivity type as contact region to the band of the first conductivity type.

For fabricating a pnp vertical bipolar transistor according to the method of the present invention, the flow of the above process steps applies in analogous fashion with a reversal of conductivity types.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the method may comprise steps of annealing the high and/or medium energy implants at elevated temperature. As another example, the process steps may be modified by implanting the ions of the opposite conductivity type at high energy after the process step of implanting the ions of the opposite conductivity type at medium energy. It is therefore intended that the appended claims encompass any such modifications or embodiments.

We claim:

1. An integrated circuit fabricated in a semiconductor material having a surface of a first conductivity type, said circuit having at least one vertical bipolar transistor surrounded at least in part by a dielectric isolation zone having a lower boundary, said transistor comprising:

an emitter region of opposite conductivity type;

a base contact region of said first conductivity type;

a well of opposite conductivity type surrounding said emitter and base contact regions, extending from said surface deep into said semiconductor material;

a collector region of said opposite conductivity type buried in said semiconductor material;

a subsurface base region comprising a semiconductor band of said first conductivity type between said collector and said emitter, surrounded by said well and forming a junction with both said emitter and said collector regions, said base region having a high resistivity, thereby enabling said transistor to operate with a low breakdown voltage for low ESD clamping voltage and high beta;

said collector extending laterally to said well, thereby electrically isolating the base and emitter of said transistor, and extending vertically below said base and emitter, said collector having an upper boundary above the lower boundary of said dielectric isolation zone, and a lower boundary below the lower boundary of said isolation zone, wherein the depth of the lower boundary of said isolation zone is from 300 to 400 nm.

2. The circuit according to claim 1 wherein said semiconductor material is selected from a group consisting of silicon, silicon germanium, gallium arsenide, and any other semiconductor material used in integrated circuit fabrication.

3. The circuit according to claim 1 wherein said semiconductor of the first conductivity type is made of p-type silicon having a resistivity of about 1 to 50 $\Omega$cm, and said emitter and buried collector are made of n-type silicon.

4. The circuit according to claim 1 wherein said semiconductor of the first conductivity type is a semiconductor epitaxial layer.

5. The circuit according to claim 1 wherein said semiconductor of the first conductivity type has a dopant species selected from a group consisting of boron, aluminum, gallium, and indium, while said regions of opposite conductivity type have a dopant species selected from a group consisting of arsenic, phosphorus, antimony, and bismuth.

6. The circuit according to claim 1 wherein said semiconductor of the first conductivity type is made of n-type silicon having a resistivity of about 5 to 50 $\Omega$cm, and said emitter and buried collector are made of p-type silicon.

7. The circuit according to claim 1 wherein said semiconductor of the first conductivity type has a dopant species selected from a group consisting of arsenic, phosphorus, antimony, bismuth, and lithium, while said regions of opposite conductivity type have a dopant species selected from a group consisting of boron, aluminum, gallium, indium, and lithium.

* * * * *